United States Patent
Suzuki

(10) Patent No.: US 11,222,700 B2
(45) Date of Patent: Jan. 11, 2022

(54) MEMORY SYSTEM

(71) Applicant: Kioxia Corporation, Minato-ku (JP)

(72) Inventor: Shinji Suzuki, Sagamihara (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/934,082

(22) Filed: Jul. 21, 2020

(65) Prior Publication Data

US 2021/0090659 A1 Mar. 25, 2021

(30) Foreign Application Priority Data

Sep. 19, 2019 (JP) .............. JP2019-170691

(51) Int. Cl.

| | |
|---|---|
| G11C 16/16 | (2006.01) |
| G11C 16/14 | (2006.01) |
| G11C 16/26 | (2006.01) |
| G11C 16/34 | (2006.01) |
| G11C 16/30 | (2006.01) |
| G11C 16/08 | (2006.01) |

(52) U.S. Cl.
CPC .............. *G11C 16/14* (2013.01); *G11C 16/08* (2013.01); *G11C 16/16* (2013.01); *G11C 16/26* (2013.01); *G11C 16/30* (2013.01); *G11C 16/3404* (2013.01)

(58) Field of Classification Search
CPC ..... G11C 16/14; G11C 16/26; G11C 16/3404; G11C 16/30; G11C 16/08; G11C 16/0483; G11C 16/10
See application file for complete search history.

(56) References Cited

U.S. PATENT DOCUMENTS

| | | | |
|---|---|---|---|
| 2006/0250855 A1 | 11/2006 | Van Duuren | |
| 2009/0147572 A1* | 6/2009 | Aritome | G11C 16/107 365/185.03 |
| 2010/0199056 A1* | 8/2010 | Zitlaw | G11C 16/10 711/166 |
| 2011/0157982 A1* | 6/2011 | Lee | H01L 27/11521 365/185.03 |
| 2012/0014179 A1* | 1/2012 | Choy | G11C 16/0483 365/185.3 |
| 2013/0279265 A1* | 10/2013 | Lee | G11C 16/14 365/185.24 |
| 2014/0104950 A1* | 4/2014 | Yano | G11C 16/10 365/185.12 |

(Continued)

FOREIGN PATENT DOCUMENTS

JP 2007-502489 A 2/2007

*Primary Examiner* — Jay W. Radke
(74) *Attorney, Agent, or Firm* — Oblon, McClelland, Maier & Neustadt, L.L.P.

(57) ABSTRACT

According to one embodiment, a memory system includes: a memory device including a memory cell transistor; and a controller configured to make first data inaccessible from an outside of the memory system without erasing the first data, and increase a threshold voltage of the memory cell transistor, before determining to write data into the memory cell transistor. The controller is further configured to decrease, after determining to write second data into the memory cell transistor, the threshold voltage of the memory cell transistor to bring the memory cell transistor into an erase state; and write, after bringing the memory cell transistor into the erase state, the second data into the memory cell transistor.

20 Claims, 14 Drawing Sheets

(56) References Cited

U.S. PATENT DOCUMENTS

| | | | |
|---|---|---|---|
| 2014/0297924 A1* | 10/2014 | Sanda | G11C 11/5635 711/103 |
| 2015/0117112 A1* | 4/2015 | He | G11C 16/345 365/185.19 |
| 2020/0043556 A1* | 2/2020 | Moon | G06F 3/0679 |

* cited by examiner

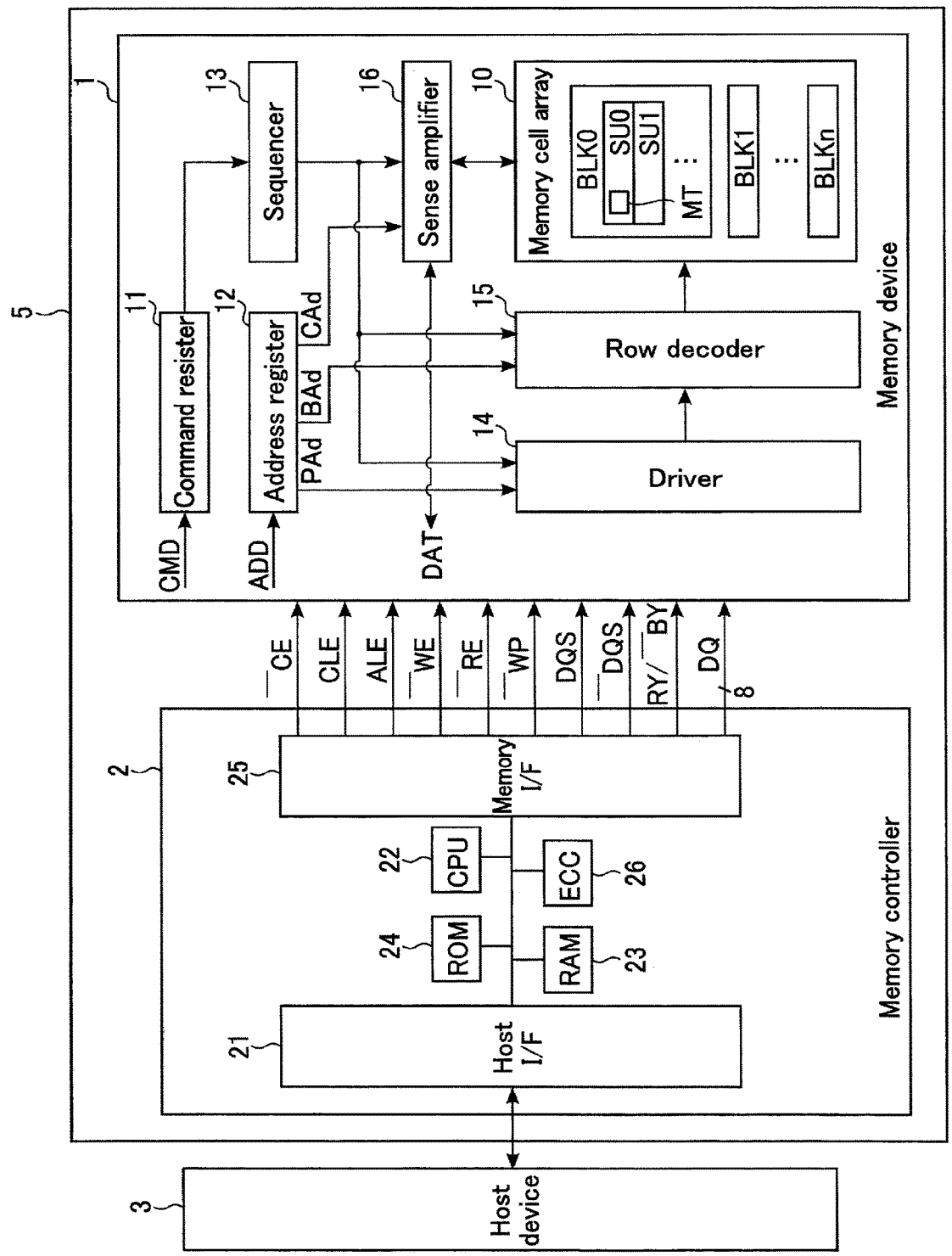
F I G. 1

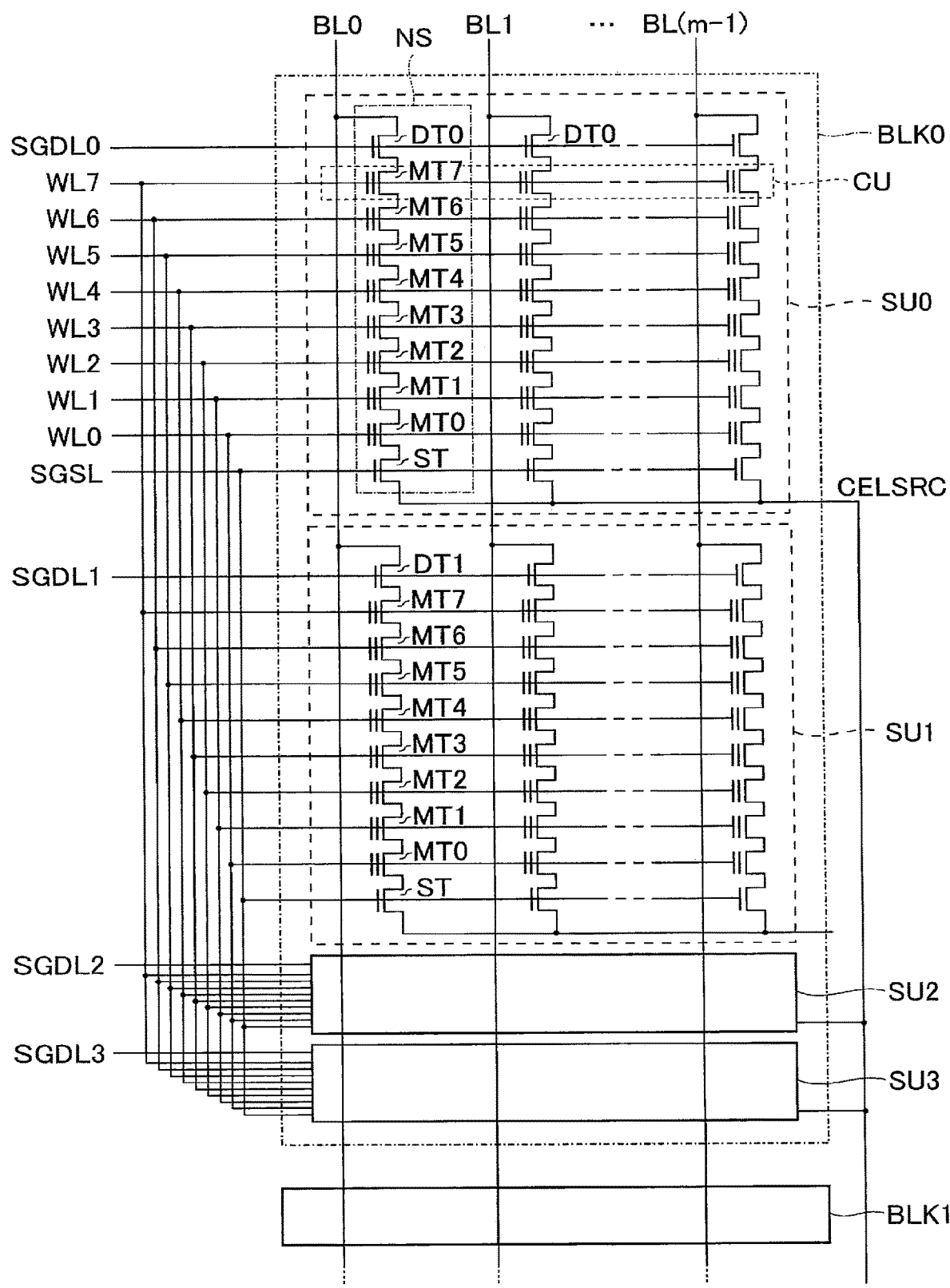
F I G. 2

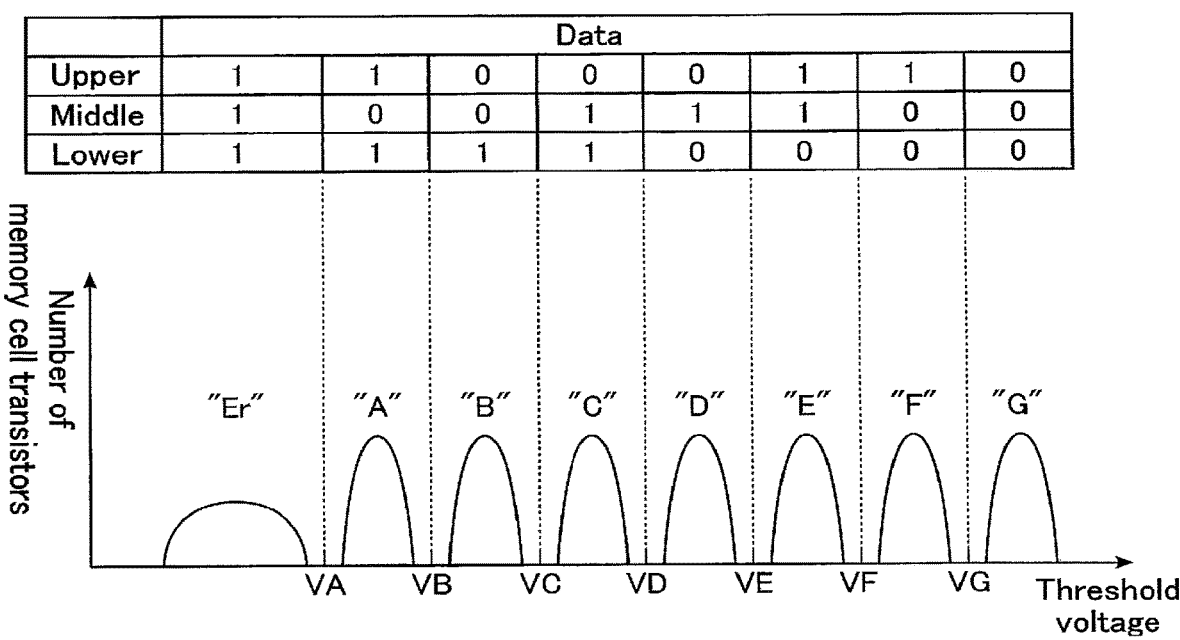
F I G. 4

31

| Logical address | Physical (block) address |
|---|---|
| 0000 - 0FFF | 0001 |
| 1000 - 1FFF | 0005 |
| 2000 - 2FFF | 0100 |
| 3000 - 3FFF | 0A00 |
|  |  |
| 4000 - 4FFF | 0003 |
| 5000 - 5FFF | 0123 |
| 0000 - 0FFF | 0124 |
| ⋮ | ⋮ |

F I G. 5

32

| Invalid data block address | Pre-program execution flag |
|---|---|
| 0020 | Done |
| 0111 | Done |
| 0112 | Undone |
| 0A01 | Done |
| ⋮ | ⋮ |

FIG. 6

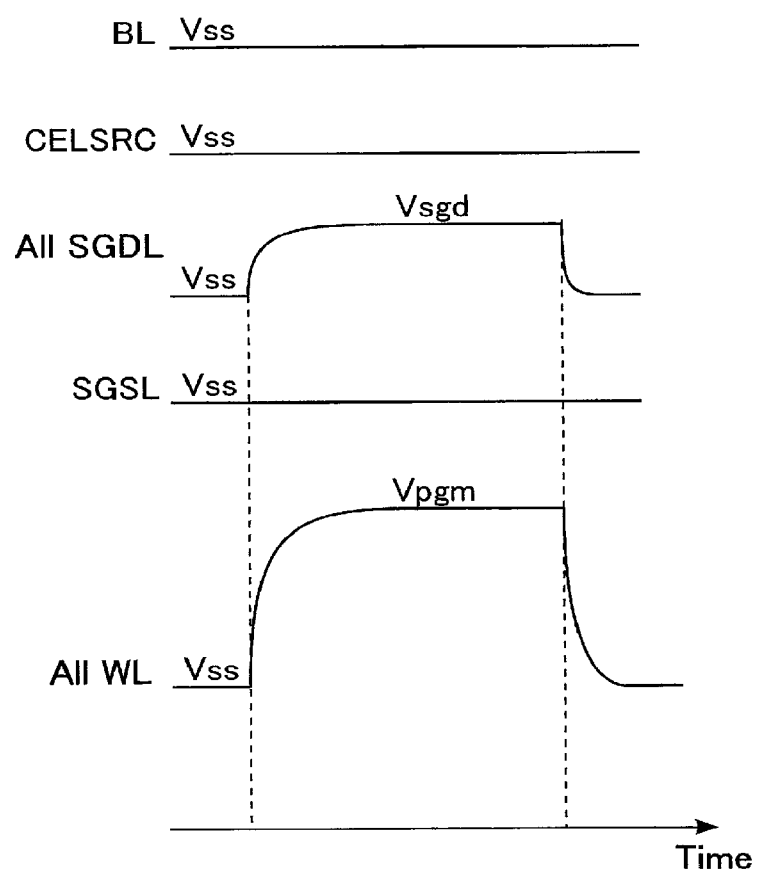
F I G. 10

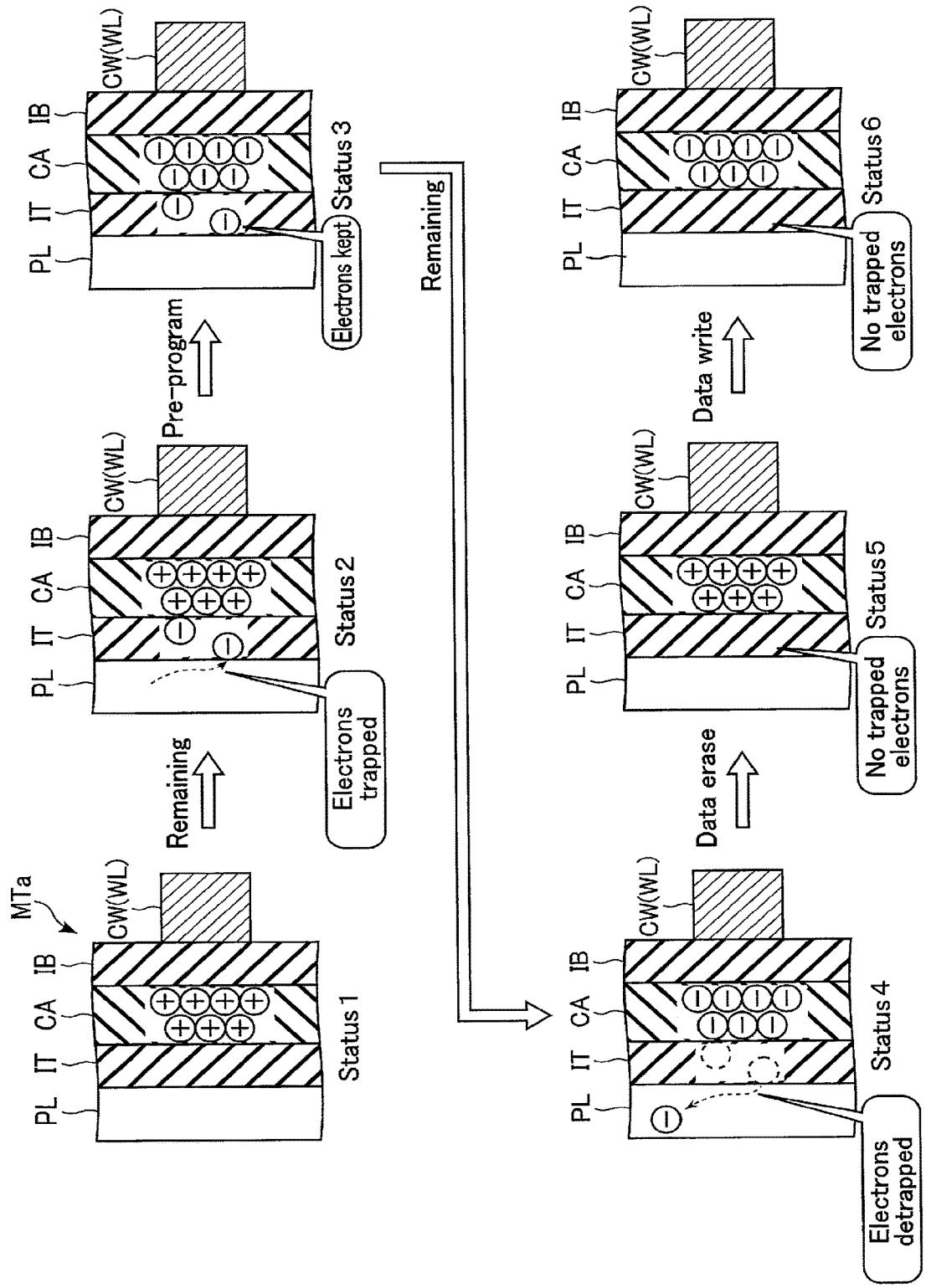
F I G. 14

MEMORY SYSTEM

CROSS-REFERENCE TO RELATED APPLICATIONS

This application is based upon and claims the benefit of priority from Japanese Patent Application No. 2019-170691, filed Sep. 19, 2019, the entire contents of which are incorporated herein by reference.

FIELD

Embodiments described herein relate generally to a memory system.

BACKGROUND

A memory system that includes a memory device and a controller configured to control the memory device is known.

BRIEF DESCRIPTION OF THE DRAWINGS

FIG. 1 is a block diagram showing components and connections in a memory system according to a first embodiment and their related components.

FIG. 2 shows an example of components and connections in a block according to the first embodiment.

FIG. 4 shows a threshold voltage distribution for memory cell transistors and a mapping of data according to the first embodiment.

FIG. 5 shows an example of an address translation table according to the first embodiment.

FIG. 6 shows an example of a block status management table according to the first embodiment.

FIG. 10 shows voltages applied to several components during the pre-program according to the first embodiment.

FIG. 14 shows several statuses that can occur in a memory cell transistor according to the operation flow according to the first embodiment in time series.

DETAILED DESCRIPTION

Figure 3:
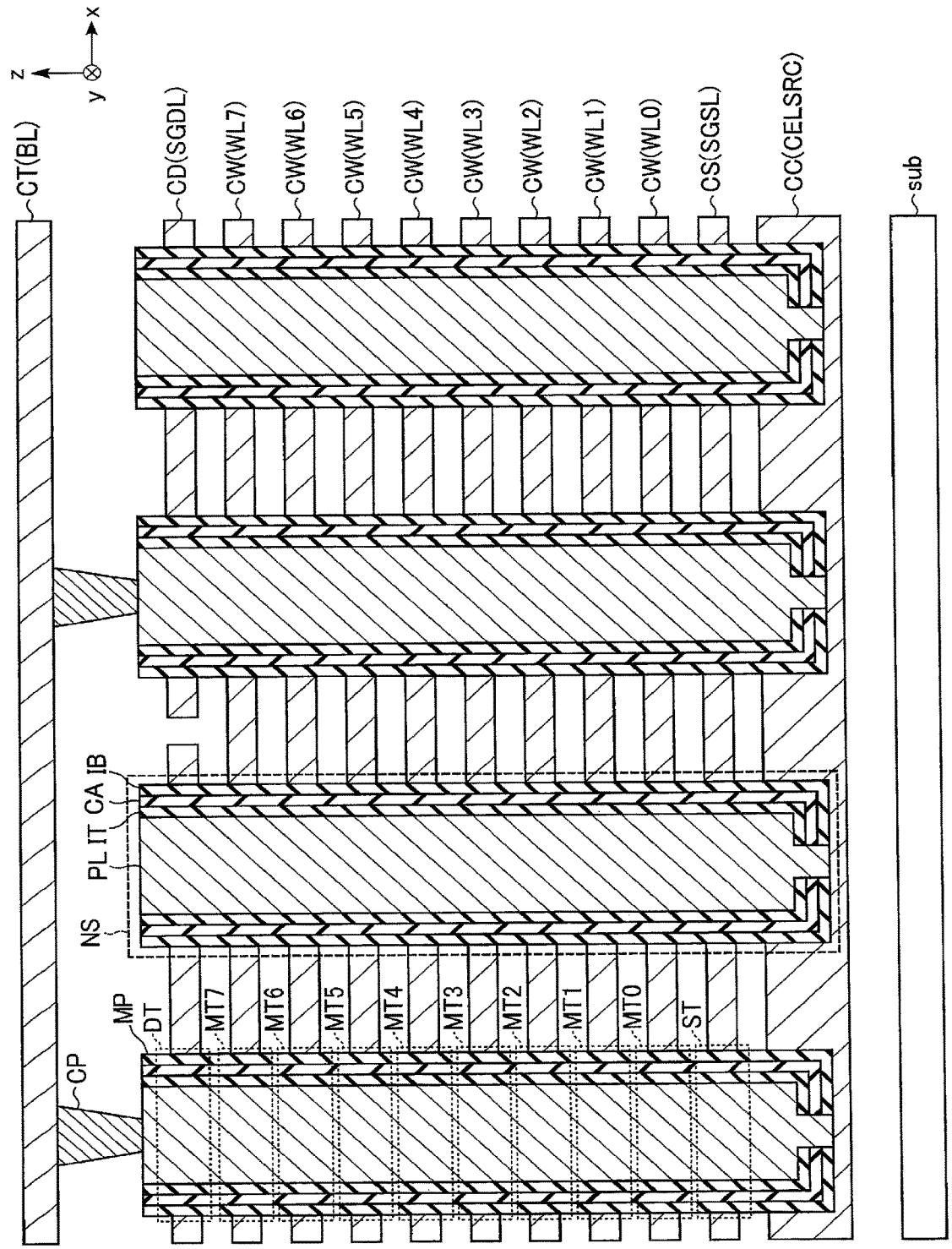
FIG. 3 shows a structure of part of a block according to the first embodiment.

According to one embodiment, a memory system includes: a memory device including a memory cell transistor; and a controller configured to make first data inaccessible from an outside of the memory system without erasing the first data, and increase a threshold voltage of the memory cell transistor, before determining to write data into the memory cell transistor. The controller is further configured to decrease, after determining to write second data into the memory cell transistor, the threshold voltage of the memory cell transistor to bring the memory cell transistor into an erase state; and write, after bringing the memory cell transistor into the erase state, the second data into the memory cell transistor.

Embodiments will now be described with reference to the figures. In the following description, components with substantially the same functionalities and configurations will be referred to with the same reference numerals, and repeated descriptions may be omitted. Moreover, the entire description for a particular embodiment also applies to other embodiments unless explicitly mentioned otherwise or obviously eliminated.

Each functional block can be implemented as hardware, computer software, or combination of the both. For this reason, in order to clearly illustrate that each block can be any of hardware, software or combination thereof, descriptions will be made in terms of their functionalities in general. It is not necessary that functional blocks are distinguished as in the following examples. For example, some of the functions may be implemented by functional blocks different from those illustrated below.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

1. First Embodiment

1.1. Structure (Configuration)

FIG. 1 illustrates components and connections in a memory system according to a first embodiment and related components. In FIG. 1, a memory system 5 is controlled by a host device 3 and includes a memory device 1 and a memory controller 2. The memory system 5 may be a solid-state drive (SSD) or an SD™ card, for example.

The memory controller 2 controls the memory device 1. The memory controller 2 receives instructions from the host device 3, and controls the memory device 1 based on the received instructions.

1.1.1. Memory Controller

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 executes various operations and some of the functions of the host interface 21 and the memory interface 25 by causing the CPU 22 to execute firmware (or, programs) stored in the ROM 24 and loaded in the RAM 23. The RAM 23 further temporarily stores data and functions as a buffer memory and a cash memory. The RAM 23 also stores an address translation table and a block status management table. The address translation table and the preprogram management table will be described later.

The host interface 21 is connected to the host device 3 via a bus and controls communications between the memory controller 2 and the host device 3. The memory interface 25 is connected to the memory device 1 and controls communications between the memory controller 2 and the memory device 1.

The ECC circuit 26 performs a necessary process to detect and correct errors on data to be written into the memory device 1 and data read from the memory device 1. To be more specific, the ECC circuit 26 performs an error-correction coding process on the data (substantial write data) to be written into the memory device 1. The redundant-data containing data obtained by the error-correction coding is written into the memory device 1 as write data. Further, the ECC circuit 26 detects errors in the data read from the memory device 1 and attempts to correct errors if any.

1.1.2. Memory Device

The memory device 1 is coupled to the memory controller 2 via a NAND bus. The NAND bus transfers control signals and an 8-bit input and output signal DQ. The control signals include signals ⁻CE, CLE, ALE, ⁻WE, ⁻RE, and ⁻WP, data strobe signals DQS and /DQS, and a ready/busy signal RY/⁻BY. The symbol "⁻" indicates inverted logic. The memory device 1 receives the input and output signal DQ, and transmits the input and output signal DQ. The input and output signal DQ includes commands (CMD), write data or read data (DAT), address information (ADD), and status (STA).

The signal ⁻CE enables the memory device 1. The signal CLE notifies the memory device 1 of transmission of a command through the input and output signal DQ. The signal ALE notifies the memory device 1 of transmission of an address signal through the input and output signal DQ. The signal ⁻WE instructs the memory device 1 to take in the input and output signal DQ. The signal ⁻RE instructs the memory device 1 to output the input and output signal DQ. The ready/busy signal RY/⁻BY indicates whether the memory device 1 is in a ready state or in a busy state, indicating the busy state when being at the low level. In the ready state, the memory device 1 accepts commands, while in the busy state it does not accept any commands.

The memory device 1 includes components such as a memory cell array 10, a command register 11, an address register 12, a sequencer 13, a driver 14, a row decoder 15, and a sense amplifier 16.

The memory cell array 10 includes memory blocks BLK (BLK0, BLK1, . . . ). Each block BLK is a set of string units SU (SU0, SU1, . . . ). Each string unit SU is a set of NAND strings (string) NS (not shown). Each string NS includes memory cell transistors MT.

The command register 11 stores the commands CMD received from the memory controller 2. The commands CMD instruct the sequencer 13 on various operations including data read, data write, and data erase.

The address register 12 stores the address information ADD received from the memory controller 2. The address information ADD includes, for example, a block address BAd, a page address PAd, and a column address CAd. The block address BAd, the page address PAd, and the column address CAd are used to respectively select a block BLK, a word line WL, and bit lines BL.

The sequencer 13 controls the overall operations of the memory device 1. The sequencer 13 controls the driver 14, the row decoder 15, and the sense amplifier 16 on the basis of the commands CMD received from the command register 11, to perform various operations including data read, data write, data erase, etc.

The driver 14 generates various potentials necessary for the operations of the memory device 1 and provides selected ones of the potentials for the row decoder 15.

The row decoder 15 transfers the potentials provided by the driver 14 to one block BLK selected based on the block address BAd received from the address register 12.

The sense amplifier 16 senses the status of the memory cell transistors MT to generate the read data based on the sensed status, or transfers the write data to the memory cell transistors MT.

1.1.3. Memory Cell Array

FIG. 2 illustrates an example of several components and connections in the memory cell array 10 according to the first embodiment, illustrating the components and connections in a single block BLK0, and their related components. Two or more of the blocks BLK, for example, all of the blocks BLK, include the components and connections illustrated in FIG. 2.

One block BLK includes a plurality of string units, for example, four string units, SU0 to SU3.

In each block BLK, each of m (where m is a natural number) bit lines BL0 to BL(m−1) is coupled to one string NS from each of the string units SU0 to SU3.

Each string NS includes one select gate transistor ST, a plurality of (eight, for example) memory cell transistors MT such as MT0 to MT7, and another select gate transistor DT such as DT0, DT1, DT2, or DT3. The transistors ST, MT, and DT are serially coupled in this order between a source line CELSRC and one bit line BL. A memory cell transistor MT includes a control gate electrode (word line WL) and a charge storage layer insulated from the surroundings, and can store data in a nonvolatile manner based on the amount of charge in the charge storage layer. Each string NS may further include one or more dummy transistors that are not used for storing data. A word line WL coupled to a dummy transistor is referred to as a dummy word line DWL, and is distinguished from the word lines WL.

The strings NS respectively coupled to different bit lines BL constitute one string unit SU. In each string unit SU, the control gate electrodes of the memory cell transistors MT0 to MT7 are respectively coupled to word lines WL0 to WL7. A set of memory cell transistors MT sharing a word line WL in one string unit SU is referred to as a cell unit CU.

The transistors DT0 to DT3 (in FIG. 2, DT2 and DT3 are not illustrated) belong to the string units SU0 to SU3, respectively. The gate of the transistor DT0 of each of the plurality of strings NS in the string unit SU0 is coupled to a select gate line SGDL0. Similarly, the gates of the transistors DT1, DT2, and DT3 of each of the plurality of strings NS in each of the string units SU1, SU2, and SU3 are coupled to select gate lines SGDL1, SGDL2, and SGDL3.

Each block BLK can have the structure shown in FIG. 3. FIG. 3 schematically shows a structure of part of the memory cell array according to the first embodiment. As shown in FIG. 3, a substrate sub extends along the x-y plane. A conductor CC is provided above the substrate sub. The conductor CC serves as the source line CELSRC. A plurality of strings NS are provided above the conductor CC.

Each string NS includes a memory pillar MP. The memory pillar MP includes a semiconductor pillar PL, a tunnel insulator (layer) IT, a charge storage layer CA, and a block insulator (layer) IB.

The pillar PL extends along the z axis with its bottom being in contact with the conductor CC, and serves not only as a body but also as a channel region where the channels for the transistors MT, DT, and ST are formed. The tunnel insulator IT covers the periphery of the pillar PL. The charge storage layer CA is insulative or electro-conductive, and covers the periphery of the tunnel insulator IT. The block insulator IB covers the periphery of the tunnel insulator IT. Some pillars PL have a top end coupled to a conductor CT via an electro-conductive plug CP. The conductor CT extends along the x axis, serves as one bit line BL, and has an interval from a conductor CT positioned at a different coordinate on the y axis.

A conductor CS, a plurality of (e.g., 8) conductors CW, and a conductor CD are provided above the conductor CC. The conductors CS, CW, and CD are arranged at intervals in this order along the z axis. The conductors CS, CW, and CD respectively serve as a select gate line SGSL, word lines WL0 to WL7, and a select gate line SGDL for each string NS. The conductors CW are split with respect to the y-z plane, and an area including each split portion corresponds to a single block BLK. In each block BLK, the conductor CD is split with respect to the y-z plane, and an area including each split portion corresponds to one string unit SU.

A pillar PL, a tunnel insulator IT, a charge storage layer CA, and sections of a block insulators IB at crossings with the conductors CS, CW, or CD serve as a select gate transistor ST, a cell transistor MT, or a select gate transistor DT, respectively.

In the area above the conductor CC, the portion having none of the illustrated components is provided with an intra-layer insulator.

1.1.4. Cell Transistors

The memory device 1 can store data of two bits or more in one memory cell transistor MT. FIG. 4 illustrates mapping between the threshold voltage distribution of memory cell transistors MT that store three bits of data per memory cell transistor MT and the data in the memory system according to the first embodiment, as an example. The threshold voltage of each memory cell transistor MT has a value corresponding to the stored data. In the case of storing three bits per memory cell transistor MT, each memory cell transistor MT can be in a state corresponding to a threshold voltage from among eight states. The eight states are referred to as "Er" state and "A" state, "B" state and "C" state, "D" state and "E" state, and "F" state and "G" state. Memory cell transistors MT in the "Er", "A", "B", "C", "D", "E", "F", and "G" states have higher threshold voltages in this order. The "Er" state corresponds to the erase state. The memory cell transistors MT in several states have a negative threshold voltage. For example, the memory cell transistors MT in the "Er" state or the "A" state have a negative threshold voltage.

By a data write, a write target memory cell transistor MT is either maintained in the "Er" state, or brought into one of "A", "B", "C", "D", "E", "F", and "G" states, according to data to be written.

Three bits of data are assignable in any format to each state. Each state is treated as having the following three-bit data, for example. In the following "ABC" notation, A, B, and C represent the values of the upper, middle, and lower bits, respectively.

"Er" state: "111"
"A" state: "101"
"B" state: "001"
"C" state: "011"
"D" state: "010"
"E" state: "110"
"F" state: "100"
"G" state: "000"

Even a plurality of memory cell transistors MT that store identical three-bit data can have different threshold voltages due to variations in the characteristics of the memory cell transistors MT.

In order to determine the data stored in a data-read-target memory cell transistor (selected memory cell transistor) MT, the state of the selected memory cell transistor MT is determined. The range within which the threshold voltage of the selected memory cell transistor MT falls is used to determine the state of the selected memory cell transistor MT. For the determination of the range of the threshold voltage of the selected memory cell transistor MT, read voltages VA, VB, VC, VD, VE, VF, and VG are used.

The group of data of the bits at the same positions (or, digits) of the memory cell transistors MT in a cell unit CU forms a page. The group of data of the most-significant (or, first-digit) bits of the memory cell transistors MT in each cell unit CU is referred to as an upper page. The group of data of the second most-significant bits of the memory cell transistors MT in each cell unit CU is referred to as a middle page. The group of data of the least-significant (or, third-digit) bits of the memory cell transistors MT in each cell unit CU is referred to as a lower page.

The data erase decreases the threshold voltage of an erase-target memory cell transistor to bring the transistor into the "Er" state.

1.2. Operation

1.2.1. Storing of Tables By RAM

The memory controller 2 manages the status of data stored by the memory device 1, using any mechanism. The management includes at least management as to where in the memory device 1 the data having a first type of address allocated by the host device 3 is stored.

The host device 3 divides the memory space provided by the memory system 5 into a plurality of logical areas, assigns a unique first type of address to each logical area, and manages the memory space of the memory system 5 using the first type of address. The first type of address may be referred to as a logical address. When it is determined that write target data will be stored in a certain logical area, the host device 3 assigns the determined logical address to the write target data. Then, the host device 3 instructs the memory controller 2 to write the write target data into the logical area identified by the logical address.

When the memory controller 2 is requested by the host device 3 to write data with a certain logical address, the memory controller 2 writes the write-request target data into the memory device 1. On the other hand, the memory controller 2 manages the memory space of the memory device 1 using an addressing system different from that for the logical address. The memory controller 2 manages the relationship between the area in the memory device 1 into which the write-request target data is written and the logical address of the write-request target data, in any manner.

The same applies to a data read request and a data erase request from the host device 3. When the memory controller 2 receives from the host device 3 a request to read the data with a certain logical address, the memory controller 2 reads the data from the area in the memory device 1 where the read-request target data is stored. When receiving the data erase request, the memory controller 2 erases the erase-request target data from the memory device 1. However, the data erase in the memory device 1 is not necessarily performed immediately in response to the data erase request from the host device 3. Namely, the memory controller 2 does not actually erase the erase-request target data from the memory device 1 but treats the logical address of the erase-request target data as unassigned. In this way, the host device 3 recognizes the data of the logical address as absent. This in turn makes the data of such a logical address inaccessible from the outside the memory system 5. Such data that is absent (is erased) for the host device 3, i.e., in the memory system 5, but is in actuality stored in the memory device 1 will be hereinafter referred to as invalid data. On the other hand, the data with a valid logical address, which is present (is stored) for the host device 3, i.e., in the memory system 5, will be referred to as valid data.

The management as described above can be attained by, for example, using the table shown in FIG. 5. FIG. 5 shows an example of an address translation table 31 stored by the memory controller 2 according to the first embodiment. The address translation table 31 includes a set of data associated with each other as shown in FIG. 5.

The address translation table 31 has a plurality of entries. Each entry includes a logical address and a second type of address associated with the logical address. The second type of address may be referred to as a physical address. When the memory controller 2 receives from the host device 3 a request to write the data with a certain logical address, the memory controller 2 determines an area to write the write request data into, among the areas in the memory device 1 where data is not yet written. Then, the memory controller 2 creates an entry for the logical address of the data requested to be written and writes, into the created entry, a physical address indicating the determined write destination. The physical address is an address in the memory device 1. One physical address specifies one block BLK, one string unit SU, one cell unit CU, and one page. In the address translation table 31, an address of a block BLK can be used as the physical address. The description given below is based on this example.

The memory controller 2, when being requested to read the data with a certain logical address, refers to the address translation table to learn the physical address associated with the logical address, and reads out data from the block BLK of the physical address.

The memory controller 2, when being requested to erase the data with a certain logical address, eliminates the entry including the logical address of the data requested to be erased, from the address translation table. As a result, the association between the logical address of the data requested to be erased and the physical address having stored the data with the logical address is canceled. Then, the data requested to be erased by the host device 3 is turned into invalid data.

The memory controller 2 further stores the table shown in FIG. 6 at the RAM 23. FIG. 6 shows an example of a block status management table 32 stored by the memory controller 2 according to the first embodiment.

The block status management table 32 includes the address of a block (invalid data block) BLK storing only invalid data (not storing valid data). As described above, the data requested to be erased by the host device 3 is not necessarily erased in practice at once from the memory device 1, and may be kept stored as invalid data in the memory device 1. The invalid data needs to be erased in practice before data write is performed on the block BLK storing the invalid data. Based on this, the memory controller 2 manages the block BLK storing only invalid data using the block status management table 32. When a block BLK storing only invalid data occurs, the memory controller 2 newly provides the block status management table 32 with an entry for the block BLK. On the other hand, when the data in a certain block BLK in the block status management table 32 is actually erased, the memory controller 2 erases the block BLK from the block status management table 32.

Each entry includes information (a pre-program flag) indicating whether a pre-program is executed. The pre-program flag indicates information on an invalid data block BLK of the entry to which this flag belongs. According to the first embodiment, the pre-program is executed on a block BLK including only the invalid data. The pre-program refers to the execution of a program irrelevant to data storage on all cell units CU in a target block BLK, and will be described later. The pre-program is not necessarily executed immediately in response to the data erase request from the host device 3, either.

The memory controller 2 manages a block BLK not pre-programmed out of blocks BLK storing only invalid data using the block status management table 32. For each entry in the block status management table 32, the memory controller 2 manages information as to whether the block BLK of the entry is pre-programmed. For that purpose, the block status management table 32 includes the pre-program flag. When an entry is added to the block status management table 32, the memory controller 2 stores a pre-program flag as a value indicating execution being undone in the entry. When the pre-program is executed on a certain block BLK of the blocks BLK included in the block status management table 32, the memory controller 2 updates the pre-program flag for the block BLK as a value indicating execution being done.

1.2.2. Data Erase and Data Write

Figure 7:
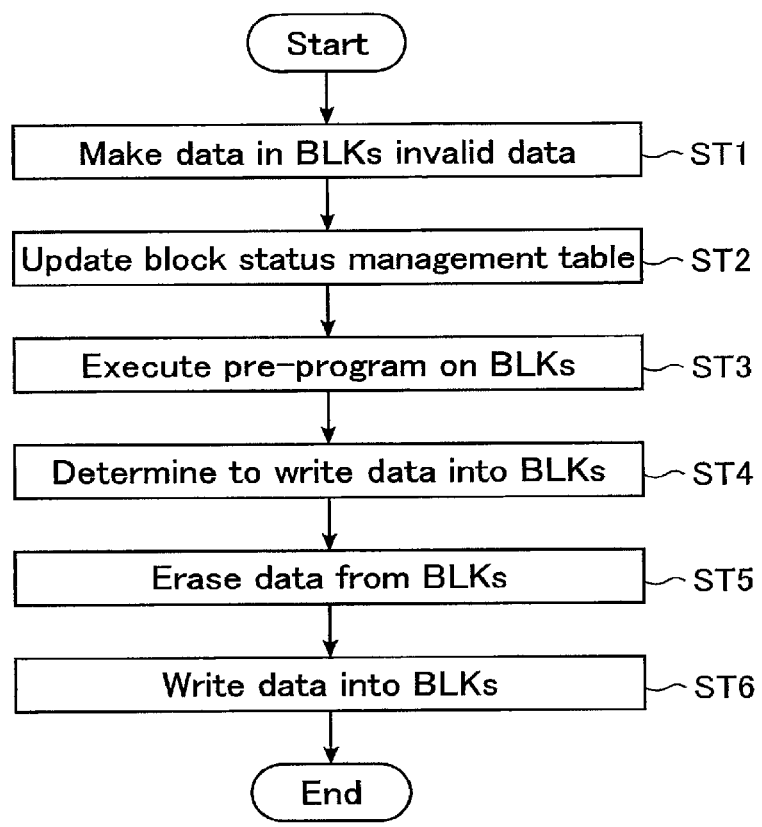
FIG. 7 shows an operation flow of a memory controller according to the first embodiment.

FIG. 7 shows an operation flow of the memory controller 2 according to the first embodiment. FIG. 7 shows a flow related to a certain block BLKs. At the beginning of the flow of FIG. 7, each cell unit CU in the block BLKs has data written thereon.

The flow starts with the start of the process in which the block BLKs transitions to a state in which the block BLKs stores only invalid data (a state in which the block BLKs does not store valid data). In step ST1, the memory controller 2 performs a process for making data in the block BLKs invalid data. Step ST1 can occur for a variety of factors, and the first embodiment is not limited by details of the reason why the block BLKs turns into invalid data. To be more specific, step ST1 can occur based on a specific request from the host device 3. In more detail, step ST1 occurs when the memory controller 2 receives from the host device 3 a request to erase the data stored in the block BLKs. Step ST1 can also occur because of garbage collection. The garbage collection starts, for example, in response to a request from the host device 3 and refers to a process for eliminating fragmentation in the memory device 1. Namely, when a certain first block BLK includes valid data and invalid data, only the valid data is copied to a second block BLK, thereby the valid data is stored in contiguous areas, thus eliminating the fragmentation of the valid data. The logical address corresponding to the valid data is updated so as to be associated with the second block BLK in the address management table, resulting in the first block BLK storing only the invalid data.

Alternatively, step ST1 can occur not based on a request from the host device 3. Such an example includes what is called a patrol. The patrol is executed by the memory controller 2 and refers to moving data for improving the status of data storage in the memory device 1. Namely, a certain cell unit CU has a low data storage performance because a specific cell unit CU is already inferior in characteristics at the time when the memory system 5 is placed in service due to, for example, variations in manufacturing processes, or the deterioration in performance could be due to use of a specific cell unit CU. By detecting such a cell unit CU and transferring the data to another cell unit CU having higher data storage characteristics, the data storage performance of the memory system 5 can be enhanced. The address translation table 31 is updated according to the moved data. Namely, if the address translation table 31 indicates that a certain first block BLK stores the data of a certain first logical address, the address translation table is updated through the patrol such that the data of the first logical address will be stored in a second block BLK that is the move destination. As a result, the block BLKs storing invalid data can also occur because of the patrol.

In step ST2, the memory controller 2 updates the block status management table 32 so as to include the block BLKs. Namely, the memory controller 2 creates an entry for the block BLKs in the block status management table 32 and sets the pre-program execution flag in the entry to be a value indicating the execution being undone.

In step ST3, the memory controller 2 executes the pre-program on the block BLKs. Triggered by the occurrence of step ST1, the memory controller 2 executes step ST3. The memory controller 2 can perform step ST3 at any timing after step ST2 as long as it is before the decision to write data into the block BLKs is made (or, step ST4, which will be described later). For example, the memory controller 2 can execute step ST3 in the period during which there is no process requested by the host device 3 left unfinished. For example, the memory controller 2 can execute step ST3 immediately after step ST2, namely, shortly after, e.g., immediately after the block BLKs is brought into the status of storing only invalid data. The memory controller 2 can execute any process between step ST2 and step ST3.

Step ST3 is performed independently of any request from the host device 3. Namely, step ST3 is voluntarily started by the memory controller 2. In order to execute step ST3, the memory controller 2 refers to the block status management table 32. The block status management table 32 should include a pre-program flag of a value for unexecution in the entry for the block BLKs. Based on this, the memory controller 2 executes the pre-program on the block BLKs. When the pre-program for a certain block BLK in the block status management table 32 is completed, the memory controller 2 updates the pre-program execution flag for the block BLK as a value indicating that the pre-program has been executed. In order to execute the pre-program for the block BLKs, the memory controller 2 gives the memory device 1 an instruction on the pre-program. The instruction on the pre-program includes the transmission of a command for the pre-program and an address to specify the pre-program target block BLKs.

In step ST4, the memory controller 2 determines to write data into the block BLKs. The determination on data write into the block BLKs can occur for a variety of reasons. The first embodiment is not limited by the reason why step ST4 occurs. To be more specific, step ST4 occurs in response to a data write request from the host device 3. More specifically, when the memory controller 2 receives a data write request from the host device 3, the memory controller 2 determines to write the write-request target data into the block BLKs unassigned. In another example, the memory controller 2 determines to write data into the block BLKs in order to execute the garbage collection or the patrol. Subsequent step ST5 and step ST6 occur, being triggered by the execution of step ST4.

In step ST5, the memory controller 2 erases the data in the block BLKs. For that purpose, the memory controller 2 instructs the memory device 1 to erase the data of the block BLKs. The instruction on the data erase includes the transmission of a command for the data erase and the address to specify the block BLKs. When the data erase is completed, the memory controller 2 eliminates the entry for the block BLKs from the block status management table 32.

In step ST6, the memory controller 2 executes the data write into the block BLKs, as determined in step ST4. For that purpose, the memory controller 2 instructs the memory device 1 to write into the block BLKs the data (write data) determined to be written into the block BLKs in step ST4. The instruction on the data write includes the transmission of a command for the data write, the address to specify the block BLKs, and the address to specify a cell unit and a page in the block BLKs. The memory controller 2 also creates an entry for a logical address of the write data in the address translation table, and enters the address of the block BLKs in the created entry. Since step ST5 is performed as a preparation to the execution of step ST6, step ST6 is executed soon after the execution of step ST5 before a long time elapses. For example, step ST6 is performed immediately after step ST5.

When step ST6 is completed, the flow comes to an end.

1.2.3. Pre-Program

Figure 8:
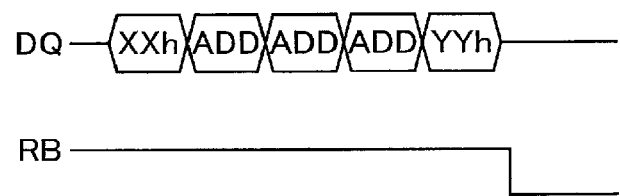
FIG. 8 shows an example of an input and output signal during a pre-program instruction according to the first embodiment.

FIG. 8 shows an example of an input and output signal DQ during a pre-program instruction according to the first embodiment. As shown in FIG. 8, the memory controller 2 transmits a command XXh, address information ADD, and a command YYh. The command XXh indicates that a pre-program instruction and address information ADD will follow. The address information ADD indicates the address of the pre-program target block BLKs and can be transmitted over a plurality of cycles. FIG. 8 shows transmissions in three cycles, as an example. The command YYh instructs the execution of the pre-program.

The memory controller 2, upon receipt of the command YYh, indicates a busy status through a ready/busy signal RY/BY and executes the pre-program on the block BLKs. The pre-program is similar to the data write (program). The data write includes repeating a plurality of program loops, each of which includes a stage at which the program is performed and a stage at which a verification is performed. The program includes increasing the threshold voltage of a program target memory cell transistor MT by injecting electrons into the charge storage layer CA of the program target memory cell transistor MT, and maintaining the threshold voltage of another program target memory cell transistor MT by inhibiting electron injection. The verification includes data read from the program target memory cell transistor MT and determination as to whether the program target memory cell transistor MT has reached a state of interest.

Figure 9:
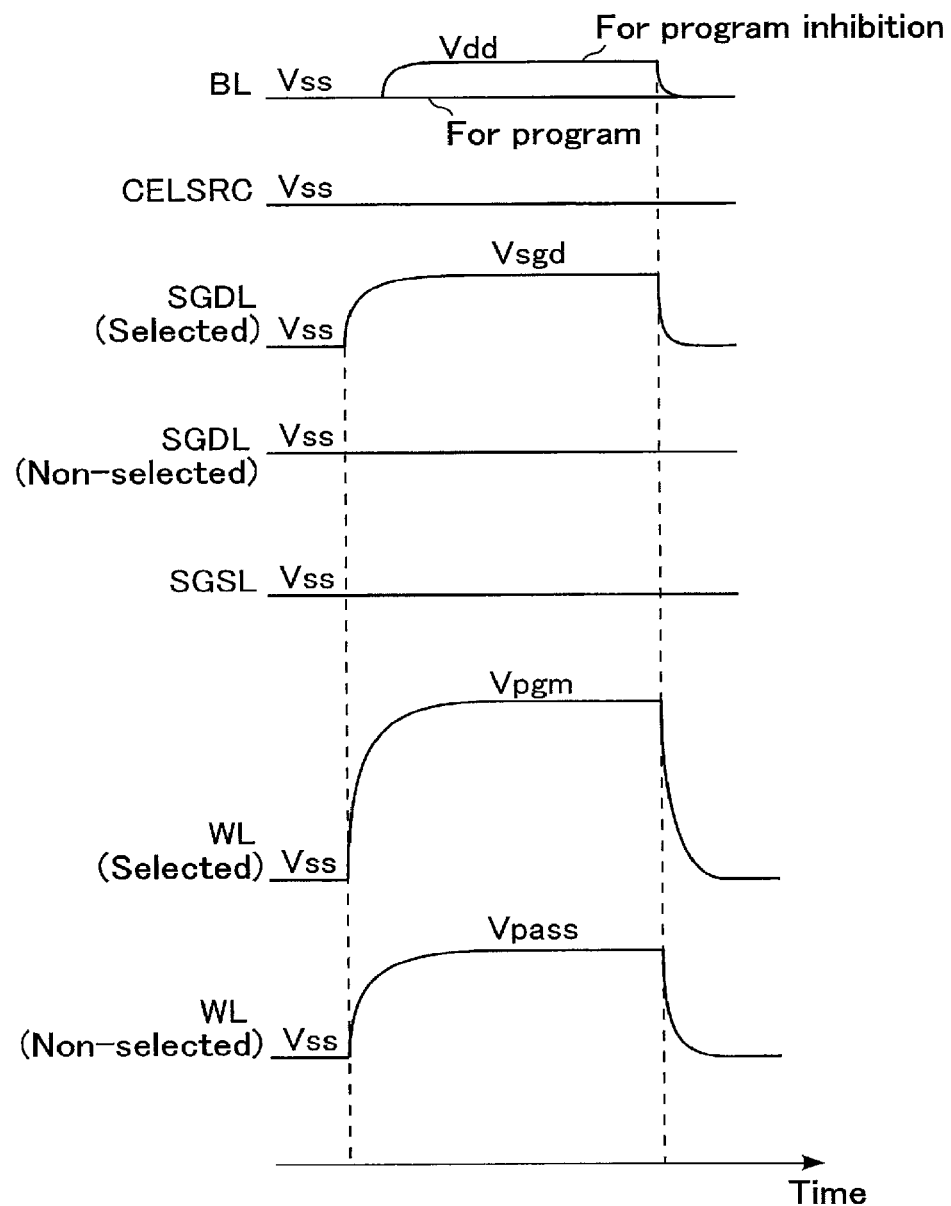
FIG. 9 shows voltages applied to several components during a program according to the first embodiment.

FIG. 9 shows voltages applied to several components during a program according to the first embodiment. The program targets only one string unit (selected string unit) SU including a data write target cell unit (selected cell unit) CU. For that purpose, a voltage Vsgd for select is applied to only the select gate line SGDL of the selected string unit SU as shown in FIG. 9. On the other hand, a voltage Vss (for example, 0 V) is continuously applied to the gate line SGDL of a string unit SU other than the selected string unit SU.

Further, a low voltage (for example, the voltage Vss) for program execution is applied to the bit line BL coupled to a memory cell transistor MT in the selected cell unit CU, whose threshold voltage is to be increased, while a high voltage (for example, a voltage Vdd) for program inhibition is applied to the bit line BL coupled to a memory cell transistor MT whose threshold voltage is not to be increased. Application of the voltage Vss to the source line CELSRC and the select gate line SGSL is maintained.

A program voltage Vpgm is applied to the word line (selected word line) WL coupled to the selected cell unit CU. A program pass voltage Vpass, which is lower than the program voltage Vpgm, is applied to word lines WL other than the selected word line WL. In order to avoid an excessive increase in the threshold voltage of a memory cell transistor MT, the program voltage Vpgm for the first program loop is low, and a program voltage Vpgm somewhat higher than the program voltage Vpgm for the previous program loop is used in every program loop. In the manner described above, the threshold voltage of a memory cell transistor MT that is a threshold-voltage-increase target in the selected cell unit CU is gradually increased in every program loop up to an intended state.

FIG. 10 shows voltages applied to several components during a pre-program according to the first embodiment. For example, the pre-program includes only one program stage and/or excludes a verify stage. In the pre-program, all the cell units CU of all the string units SU in the target block BLKs are targeted. For that purpose, the voltage Vsgd for select is applied to all the select gate lines SGDL, and the voltage Vss is applied to all the bit lines BL. In addition, a program voltage Vpgm is applied to all the word lines WL. As the program voltage Vpgm for the pre-program, the program voltage Vpgm at the first loop in the program can be used, for example. In contrast to the case of the program, the program voltage Vpgm for the pre-program is applied, for example, over a longer time than the time for the program. The program voltage Vpgm, for example, has such a magnitude that allows a negative threshold voltage to increase up to the vicinity of 0 V and/or is applied over such a period that allows a negative threshold voltage to increase up to the vicinity of 0 V. This period is, for example, longer than the period during which the voltage Vpgm is applied in one loop at the program stage.

Figure 11:
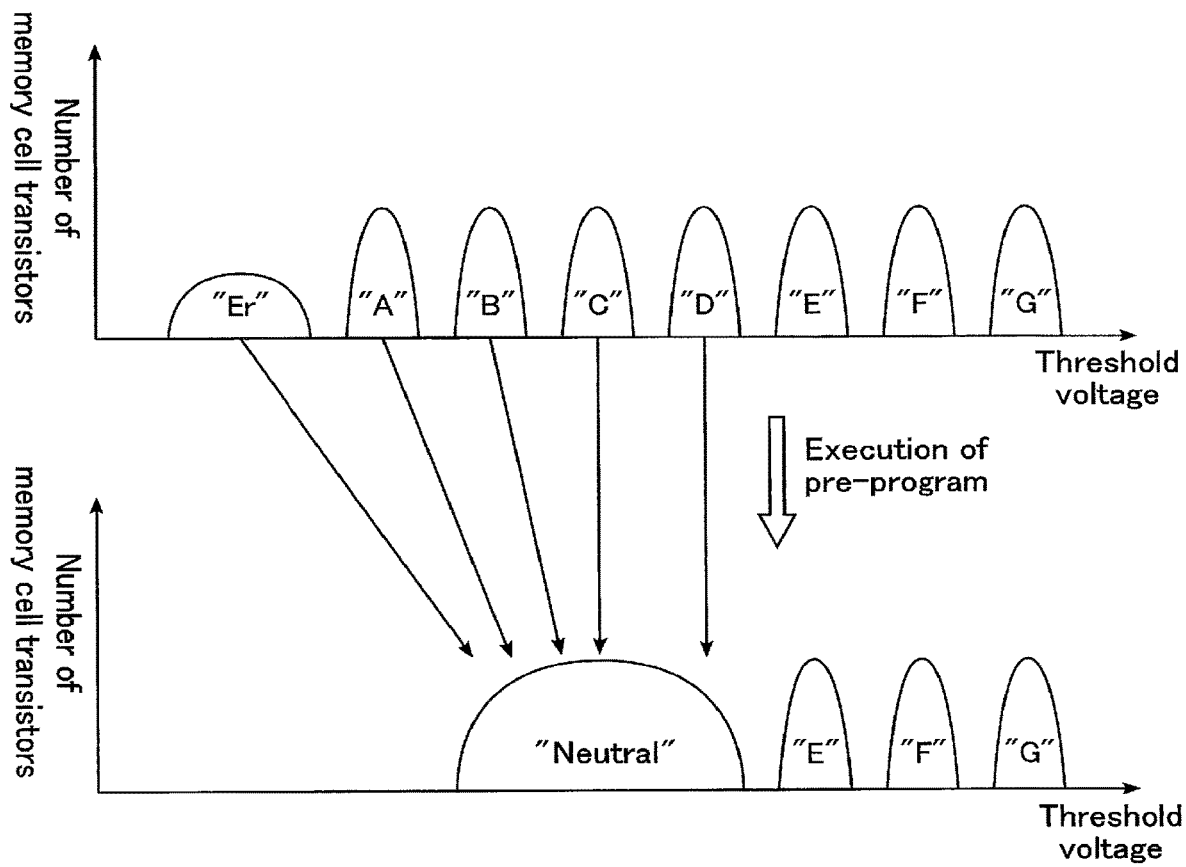
FIG. 11 shows an example of threshold voltage distribution sets at two points of time for the memory cell transistors in a block according to the first embodiment.

FIG. 11 shows an example of threshold voltage distribution sets at two points of time for the memory cell transistors in the block BLKs according to the first embodiment. The upper part of FIG. 11 shows a status before the pre-program, and the lower part shows a status after the pre-program. The upper part shows the status in step ST1 or ST2 in the flow of FIG. 7. The lower part shows the status after the completion of step ST3 and before the start of step ST5 in the flow of FIG. 7.

As shown in the upper part, each memory cell transistor MT in the block BLKs is in any of "Er", "A", "B", "C", "D", "E", "F", and "G" states.

As shown in the lower part, the threshold voltages of several memory cell transistors MT increase as compared to the status before the pre-program. In particular, a threshold voltage that has been negative before the pre-program increases. Accordingly, memory cell transistors MT having been in the "Er" state or "A" state transition to another state. This state, hereinafter, will be referred to as a neutral state. In the pre-program, the program voltage Vpgm is applied over such a period that allows a memory cell transistor MT in a state below the neutral state to transition to the neutral state. Through the pre-program, the threshold voltages for the memory cell transistors MT in the "Er" or "A" state and those for the memory cell transistors MT in the "B", "C", or "D" state increase. As a result, the threshold voltages for the memory cell transistors MT in the "Er", "A", "B", "C", or "D" state form the distribution in the neutral state. For example, the threshold voltages for the memory cell transistors MT in the neutral state are distributed from the "B" state through the "D" state.

On the other hand, the threshold voltages for the memory cell transistors MT that are in the "E", "F", or "G" state before the pre-program hardly or never increase. Accordingly, the threshold voltage distributions of the "E", "F", and "G" states after the pre-program are almost the same as the threshold voltage distributions of the "E", "F", and "G" states before the pre-program.

1.3. Advantages (Effects)

The first embodiment can provide the memory system 5 having a high data storage performance. This will be described using a reference example.

Figure 12:
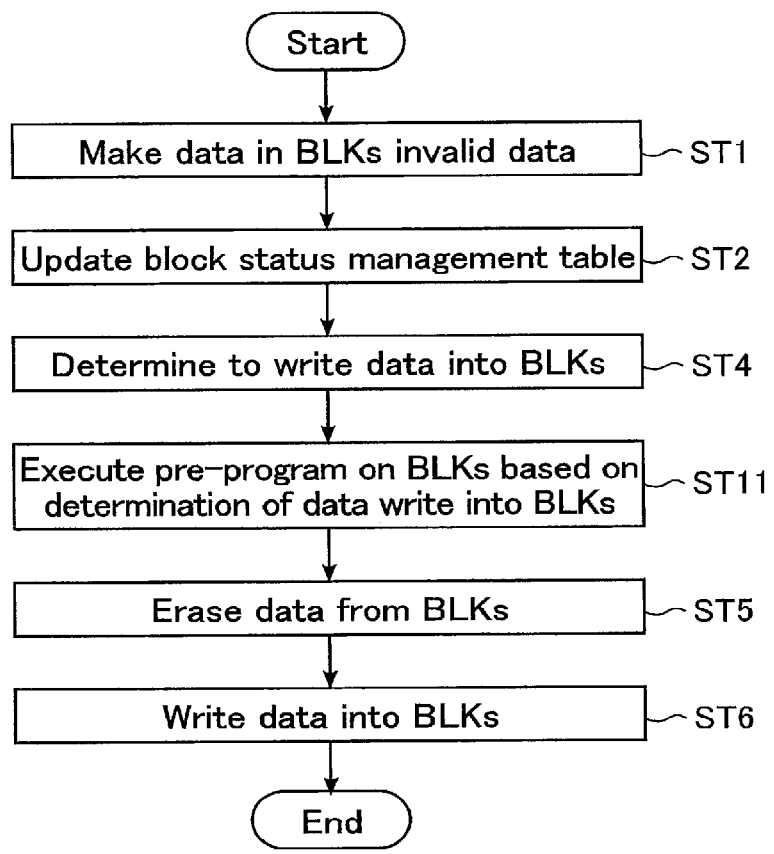
FIG. 12 shows an operation flow of a memory controller for reference.

FIG. 12 is an operation flow of a reference memory controller 100. As shown in FIG. 12, step ST2 is followed by step ST4, and step ST4 is followed by step ST11. In step ST11, the memory controller 100 executes a pre-program on a block BLKs as in step ST3 of FIG. 7. However, in contrast to memory controller 2, the execution of the pre-program in step ST11 is triggered by the data write into the block BLKs as in preceding step ST4. In other words, unless step ST4 occurs, the memory controller 100 does not execute the pre-program on the block BLKs. The flow as shown in FIG. 12 can cause a phenomenon as depicted with reference to FIG. 13 in a memory cell transistor MT in a certain status.

Figure 13:
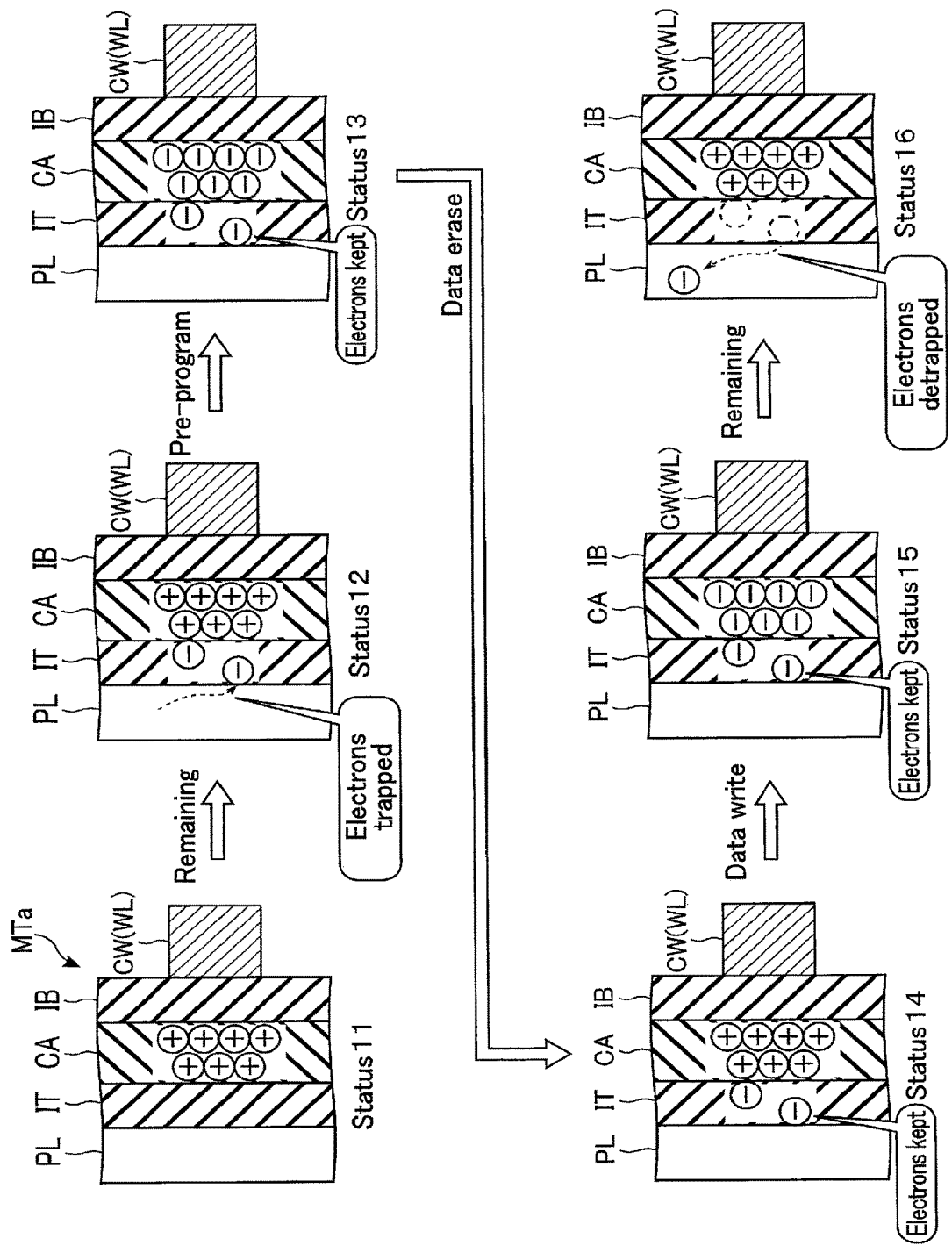
FIG. 13 shows several statuses that can occur in a memory cell transistor according to the reference operation flow in time series.

FIG. 13 shows several statuses that can occur in a memory cell transistor according to the flow of FIG. 2 in time series. The status 11 of FIG. 13 refers to a status of a certain memory cell transistor MTa in a certain block BLKa including only invalid data. The memory cell transistor MTa is in the "Er" state, and based thereon, the memory cell transistor MTa includes holes in the charge storage layer CA.

The status 12 refers to the memory cell transistor MTa after time has passed from the status 11. During the passage of time, the holes in the charge storage layer CA attract electrons to trap the electrons in the tunnel insulator IT. The status 11 and the status 12 occur during the period from step ST1 until step ST4 in the flow of FIG. 12.

The memory controller 100 determines data write into the block BLKa in step ST4, and performs pre-program on the block BLKa in step ST11 in preparation for the data write. The pre-program thus leads the memory cell transistor MTa to the status 13. In the status 13, the memory cell transistor MTa includes electrons in the charge storage layer CA. In the status 13, the trapped electrons are kept intact.

The status 14 refers to the memory cell transistor MTa after the step ST5 (data erase) has been performed. The data erase causes the memory cell transistor MTa to include holes in the charge storage layer CA. The trapped electrons are kept intact in the status 14 as well.

The status 15 refers to the memory cell transistor MTa after step ST6 (data write) has been performed. The data write causes the memory cell transistor MTa to transition to an intended state and thus to include electrons in the charge storage layer CA. The trapped electrons are kept intact in the status 15 as well. The verification on the memory cell transistor MTa is passed with the electrons trapped. Accordingly, the memory cell transistor MTa needs to include electrons in the tunnel insulator IT so as to stay in the intended state.

The status 16 refers to the memory cell transistor MTa after being left as it is from the status (status 15) after the completion of step ST6. As time passes after the completion of step ST6, the trapped electrons are released from the tunnel insulator IT (the electrons are detrapped), undergoing the repulsive force from the electrons in the charge storage layer CA. Then, the threshold voltage for the memory cell transistor MTa declines and may not stay in the intended state. This means that the flow shown in FIG. 12 can unintentionally suppress the data storage characteristics of the memory cell transistor MTa.

The description so far has concerned the example where the memory cell transistor MTa is left in the "Er" state, and the same phenomenon also occurs in the case where the memory cell transistor MTa is left in another state in which the charge storage layer includes holes, although the number of electrons to be trapped will differ.

According to the first embodiment, the memory controller 2 performs the pre-program on a block BLK that is determined to include only invalid data, regardless of whether data write into the block BLK is determined or not. Such a flow attains a memory cell transistor MT having high data storage characteristics. This will be described with reference to FIG. 14.

FIG. 14 shows several statuses that can occur in a memory cell transistor MT in accordance with the flow according to the first embodiment in FIG. 7, in time series. The status 1 and status 2 are respectively the same as the status 11 and status 12 of FIG. 13.

The status 3 refers to the memory cell transistor MTa after step ST3 (pre-program) has been performed. The pre-program causes the memory cell transistor MTa to include electrons in the charge storage layer CA. In the status 3, the trapped electrons are kept intact.

The status 4 refers to the memory cell transistor MTa after being left as it is from the status (status 3) after the completion of step ST3. As time passes after the completion of step ST3, the electrons in the tunnel insulator IT are detrapped, undergoing the repulsive force from the electrons in the charge storage layer CA.

The status 5 refers to the memory cell transistor MTa after step ST5 (data erase) has been performed. The data erase causes the memory cell transistor MTa to include holes in the charge storage layer CA.

The status 6 refers to the memory cell transistor MTa after step ST6 (data write) has been performed. The data write causes the memory cell transistor MTa to transition to an intended state and thus to include electrons in the charge storage layer CA. On the other hand, because steps ST5 and ST6 are performed in a consecutive manner (without leaving for a long time), electrons are hardly ever or never trapped by the tunnel insulator IT. The verification on the memory cell transistor MTa is performed without any electrons included in the charge storage layer CA. Accordingly, the intended state of the memory cell transistor MTa is maintained, exclusively relying on the number of electrons in the charge storage layer CA.

Even if the memory cell transistor MTa is left after the completion of step ST6, the electrons are hardly ever or never detrapped. The unintentional decline in threshold voltage for the memory cell transistor MTa due to the detrapping thus can be suppressed. Therefore, the first embodiment can provide a memory system 5 having a high data storage performance.

1.4. Modification

The description so far has concerned the example where a plurality of memory cell transistors MT share a charge storage layer CA. The first embodiment is not limited to this example. Each memory cell transistor MT may have an independent charge storage layer CA. In this example, the charge storage layer CA can be a conductor (so-called floating gate electrode).

The description so far relates to the example where the unit for data erase as well as the unit for management in the address translation table is block BLK. The first embodiment is not limited to this example, and the flow as in FIG. 7 may be executed on only one memory cell transistor MT. Namely, the memory controller 2 can allow in step ST1 the status where at least one certain memory cell transistor MTs has invalid data. In step ST3, the memory controller 2 can execute the pre-program on the memory cell transistor MTs. In step ST4, the memory controller 2 can determine write of data into the memory cell transistor MTs. In step ST5, the memory controller 2 can erase data from the memory cell transistor MTs. In step ST6, the memory controller 2 can write data into the memory cell transistor MTs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory system comprising:
a memory device including a memory cell transistor; and
a controller configured to:
make first data inaccessible from an outside of the memory system without erasing the first data;
increase a threshold voltage of the memory cell transistor, before determining to write data into the memory cell transistor;
decrease, after determining to write second data into the memory cell transistor, the threshold voltage of the memory cell transistor to bring the memory cell transistor into an erase state; and
write, after bringing the memory cell transistor into the erase state, the second data into the memory cell transistor.

2. The memory system according to claim 1, wherein the making of the first data inaccessible from the outside of the memory system includes canceling an association of a first type of address assigned to the first data with the memory cell transistor.

3. The memory system according to claim 1, wherein the controller is further configured to make the first data inaccessible from the outside of the memory system, when receiving from outside a request to erase the first data.

4. The memory system according to claim 1, wherein the controller is further configured to determine to write the second data into the memory cell transistor, when receiving from outside a request to write the second data.

5. The memory system according to claim 1, wherein the memory device includes a first memory area including the memory cell transistor, and is further configured to:
- erase data stored in the first memory area together; and
- erase data stored in the first memory area to bring the memory cell transistor into the erase state, when determining to erase data stored in the first memory area.

6. The memory system according to claim 5, wherein the memory device includes a first word line and a second word line in the first memory area,
- the first word line is coupled to the memory cell transistor, and
- the increasing of the threshold voltage of the memory cell transistor includes applying a first voltage to the first word line and the second word line.

7. The memory system according to claim 6, wherein the writing of the second data into the first memory cell transistor includes applying a third voltage while a second voltage is applied to the second word line, and
- the second voltage is lower than the first voltage and the third voltage.

8. The memory system according to claim 5, wherein the increasing of the threshold voltage of the memory cell transistor includes applying a first voltage to every word line in the first memory area.

9. The memory system according to claim 1, wherein the controller is further configured to decrease the threshold voltage of the memory cell transistor after increasing the threshold voltage of the memory cell transistor and before reading data from the memory cell transistor.

10. A memory system comprising:
- a memory device including a memory cell transistor; and
- a controller configured to:
  - make first data in the memory cell transistor inaccessible from an outside of the memory system;
  - increase a threshold voltage of the memory cell transistor, before determining to write data into the memory cell transistor;
  - decrease, after determining to write second data into the memory cell transistor, the threshold voltage of the memory cell transistor; and
  - write, after decreasing the threshold voltage of the memory cell transistor, the second data into the memory cell transistor.

11. The memory system according to claim 10, wherein the making of the first data inaccessible from the outside of the memory system is executed without erasing the first data.

12. The memory system according to claim 10, wherein the decreasing of the threshold voltage of the memory cell transistor includes bringing the memory cell transistor into an erase state.

13. The memory system according to claim 10, wherein the making of the first data inaccessible from the outside of the memory system includes canceling an association of a first type of address assigned to the first data with the memory cell transistor.

14. The memory system according to claim 10, wherein the controller is further configured to make the first data inaccessible from the outside of the memory system, when receiving from outside a request to erase the first data.

15. The memory system according to claim 10, wherein the controller is further configured to determine to write the second data into the memory cell transistor, when receiving from outside a request to write the second data.

16. The memory system according to claim 10, wherein the memory device includes a first memory area including the memory cell transistor, and is further configured to:
- erase data stored in the first memory area together; and
- erase data stored in the first memory area to bring the memory cell transistor into the erase state, when determining to erase data stored in the first memory area.

17. The memory system according to claim 16, wherein the memory device includes a first word line and a second word line in the first memory area,
- the first word line is coupled to the memory cell transistor, and
- the increasing of the threshold voltage of the memory cell transistor includes applying a first voltage to the first word line and the second word line.

18. The memory system according to claim 17, wherein the writing of the second data into the first memory cell transistor includes applying a third voltage while a second voltage is applied to the second word line, and
- the second voltage is lower than the first voltage and the third voltage.

19. The memory system according to claim 16, wherein the increasing of the threshold voltage of the memory cell transistor includes applying a first voltage to every word line in the first memory area.

20. The memory system according to claim 10, wherein the controller is further configured to decrease the threshold voltage of the memory cell transistor after increasing the threshold voltage of the memory cell transistor and before reading data from the memory cell transistor.

* * * * *